United States Patent
Saito et al.

(10) Patent No.: US 7,474,164 B2
(45) Date of Patent: Jan. 6, 2009

(54) RADAR OSCILLATOR

(75) Inventors: Sumio Saito, Atsugi (JP); Masanori Ejima, Kuki (JP); Yutaka Arayashiki, Hadano (JP)

(73) Assignees: Anritas Corporation, Tokyo (JP); Matsushita Electric Industrial Co. Ltd., Osaka (JP)

( * ) Notice: Subject to any disclaimer, the term of this patent is extended or adjusted under 35 U.S.C. 154(b) by 57 days.

(21) Appl. No.: 10/588,871

(22) PCT Filed: Jan. 27, 2006

(86) PCT No.: PCT/JP2006/301347

§ 371 (c)(1),
(2), (4) Date: Aug. 10, 2006

(87) PCT Pub. No.: WO2006/080455

PCT Pub. Date: Aug. 3, 2006

(65) Prior Publication Data

US 2007/0182501 A1  Aug. 9, 2007

(30) Foreign Application Priority Data

Jan. 28, 2005  (JP)  .............................. 2005-021628

(51) Int. Cl.
*H03B 5/08*  (2006.01)
(52) U.S. Cl. .................. 331/167; 331/117 R; 331/173
(58) Field of Classification Search ............. 331/117 R, 331/117 FE, 117 D, 107 SL, 167, 185, 186, 331/166, 173, 172, 174
See application file for complete search history.

(56) References Cited

U.S. PATENT DOCUMENTS 3,991,388 A  *  11/1976  Harshbarger ............ 331/117 R (Continued)

FOREIGN PATENT DOCUMENTS

EP  0 901 642 B1  7/2003

(Continued)

OTHER PUBLICATIONS

Second Report and Order and Second Memorandum Opinion and Order; FCC 04-285, Dec. 16, 2004.

(Continued)

*Primary Examiner*—Robert Pascal
*Assistant Examiner*—Ryan J. Johnson
(74) *Attorney, Agent, or Firm*—Frishauf, Holtz, Goodman & Chick, P.C.

(57) ABSTRACT

A radar oscillator has an oscillation unit and first and second switch circuits. The first switch circuit turns off an electric power supply to an amplifier in a non-input period of a pulse signal to set the oscillation unit in a non-oscillation state and turns on the electric power supply to the amplifier in an input period of the pulse signal to set the oscillation unit in an oscillation state. The second switch circuit turns on an electric power supply to an LC resonator in a period immediately before the pulse signal is input in a period in which the pulse signal is not input to supply a current to the LC resonator and turns off the electric power supply to the LC resonator at a timing at which the pulse signal is input, so that activation of an oscillation operation of the oscillation unit is accelerated.

8 Claims, 9 Drawing Sheets

U.S. PATENT DOCUMENTS

| | | |
|---|---|---|
| 4,272,736 A | 6/1981 | Gercekci et al. |
| 4,727,339 A | 2/1988 | Doty, II et al. |
| 5,446,419 A * | 8/1995 | Miya et al. ............... 331/99 |
| 5,966,090 A | 10/1999 | McEwan |
| 6,175,283 B1 | 1/2001 | Fehrenbach et al. |

FOREIGN PATENT DOCUMENTS

| | | |
|---|---|---|
| JP | 56-2709 | 1/1981 |
| JP | 61-137404 | 6/1986 |
| JP | 63-133704 | 6/1988 |
| JP | 2000-508501 | 7/2000 |
| JP | 2000-511281 | 8/2000 |
| JP | 2002-507728 | 3/2002 |

OTHER PUBLICATIONS

Ian Gresham et al, "Ultra-Wideband Radar Sensors for Short-Range Vehicular Applications", IEEE Transactions on Microwave Theory and Techniques, vol. 52, No. 9, pp. 2105-2122, Sep. 2004.

Mina Danesh et al, "Differential VCO and Frequency Tripler Using SiGe HBTs for the 24 GHz ISM Band", Harris Corporation, Microwave Communications Division, Montreal, QC, H9B 3G4, Canada. University of Ulm, Dept. Of Electron Devices and Circuits, 89069 Ulm, Germany. 2003 IEEE Radio Frequency Integrated Circuits Symposium, pp. 277-280.

Ian Gresham et al, "A Fast Switching, High Isolation Absorptive SPST SiGe Switch for 24 Ghz Automotive Applications", M/A-COM, Inc., Corporate Research & Development, Pawtucket Boulevard, Lowell, MA 01853 USA, 33$^{rd}$ European Microwave Conference—Munch 2003, pp. 903-906.

Notification Concerning Transmittal of Copy of International Preliminary Report on Patentabliity and Written Opinion, Chapter I of the Patent Cooperation Treaty for PCT/JP2006/301347 mailed Aug. 9, 2007. 7 sheets.

* cited by examiner

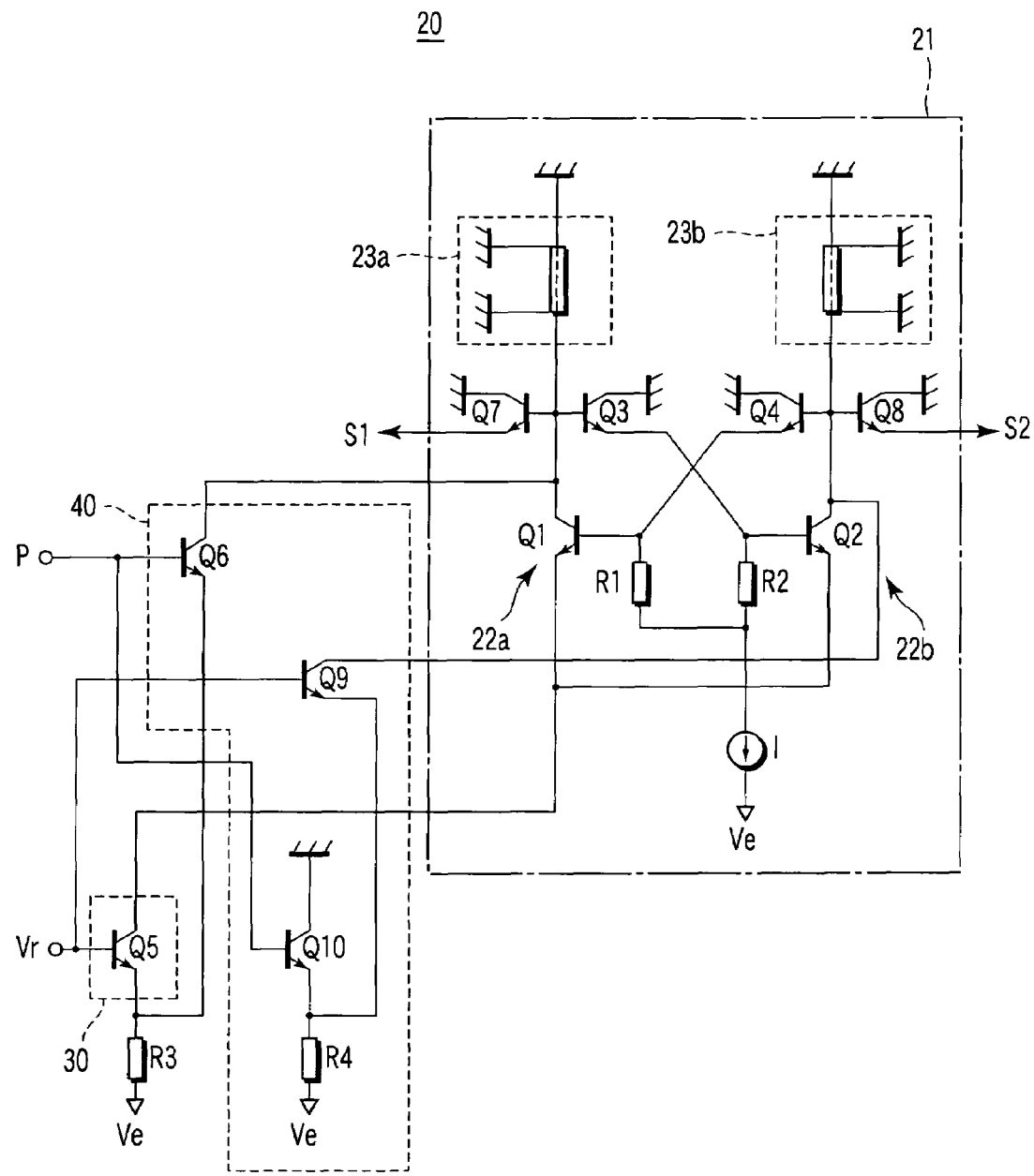
F I G. 8

RADAR OSCILLATOR

This application is a U.S. National Phase Application under 35 USC 371 of International Application PCT/JP2006/301347 filed Jan. 27, 2006.

TECHNICAL FIELD

The present invention relates to a radar oscillator and, more particularly, to a radar oscillator used in an transmitting unit of a small-output radar such as an automotive UWB (ultra-wideband) radar, the radar oscillator employing a technique which eliminates leakage and increases a response speed of the radar oscillator.

BACKGROUND ART

An oscillator used in a low-power transmitting unit such as an automotive UWB radar interrupts an output of a quasi-millimeter-wave (22 to 29 GHz) oscillation signal by an external pulse signal representing a transmission timing of a transmitting radar signal.

FIG. 10 shows a configuration of a conventional radar oscillator 10 of this type.

In FIG. 10, an oscillator 11 has an amplifier 12, a resonator 13 connected to an output section of the amplifier 12, and a feedback circuit 14 which feeds back positively an output signal from the amplifier 12 to an input side to oscillate a signal having a frequency determined by a resonant frequency of the resonator 13.

An oscillation signal output from the oscillator 11 is input to a switch 15 constituted by an electronic switch obtained by a semiconductor device turned on or off by a pulse signal P representing a transmission timing of a transmitting radar signal.

When the pulse signal P for switching the switch 15 is set at one level (for example, a low level), the switch 15 is turned on to output an oscillation signal S. When the pulse signal P is set at the other level (for example, a high level), the switch 15 is turned off, and does not to output an oscillation signal S.

DISCLOSURE OF INVENTION

However, as described above, in the conventional radar oscillator 10 in which an output path of an oscillation signal is turned on or off by the switch 15, even though the switch 15 is turned off in an open state, due to imperfection of isolation of the switch 15, leakage from the switch 15 disadvantageously prevents output of the oscillation signal from being perfectly stopped.

In particular, in the conventional radar oscillator 10, as described above, it is disadvantageously difficult to prevent leakage at a high frequency band ranging from 22 to 29 GHz.

FIG. 11 shows an operation of the oscillator having the above conventional configuration. As shown in FIG. 11A, a burst-shaped oscillation signal S as shown in FIG. 11B is output in a low-level period of the pulse signal P.

However, as shown in FIG. 11B, a leakage component S' of the oscillation signal is output due to imperfection of isolation of the switch 15 even in a high-level period of a pulse signal. A ratio of an output in a low-level period to an output in a high-level period is about 20 dB at most.

FIG. 12 shows an example of a spectrum density distribution Sx of a burst-shaped oscillation signal including the leakage component S'. The example exhibits a characteristic curve of the leakage component S' which considerably projects at a position of a carrier frequency fc.

The leakage component S' restricts a substantial receiving sensitivity of a reflected wave to a transmitting radar signal output at a normal transmission timing to narrow a search area of the radar, thereby making it difficult to detect a low-reflectance obstacle by the radar.

With respect to the UWB radar system, the Federal Communications Commission (FCC) of USA stipulates a spectrum mask substantially having a characteristic shown in FIG. 13 in the following Non-patent Document 1.

Non-patent Document 1: FCC 04-285 SECOND REPORT AND ORDER AND SECOND MEMORANDAM OPINION AND ORDER The spectrum mask is disclosed on Dec. 16, 2004. The spectrum mask is regulated accurately more than a previous spectrum mask.

In the spectrum mask, in an UWB, power densities in the range of 1.61 to 23.12 GHz and the range of 29.0 GHz or more is regulated to −61.3 dBm/MHz or less, and power densities in the range of 23.12 to 23.6 GHz and the range of 24.0 to 29.0 GHz are regulated to −41.3 dbm/MHz or less.

More specifically, according to the spectrum mask, a total amount of energy in the band is regulated. For this reason, in the UWB radar system, when the leakage component S' is large, an output level of a normal oscillation signal must be set low accordingly, and a search distance or the like must be considerably strict.

In order to avoid this, a short-pulse carrier frequency may be set in an short range device (SRD) band for a doppler radar which can conventionally accept a power density higher than −41.3 dBm/MHz.

However, near the SRD band, there is a so-called RR radiowave emission prohibited band having the range of 23.6 to 24.0 GHz in which a radiowave is prohibited by International Radio Communication Regulations (RR) from being intentionally radiated from the earth in order to protect a passive sensor of an earth exploration satellite (EESS).

For this reason, when a carrier frequency is set in the SRD band as described above, a portion having a considerably high level in the short-pulse spectrum overlaps the RR radiowave emission prohibited band. As a result, it is very difficult to suppress a power density to −61.3 dBm or less regulated by the latest spectrum mask.

In order to solve the problem of the above conventional art, it is an object of the present invention to provide a radar oscillator which increases a response speed to a pulse signal representing a transmission timing of a transmitting radar signal without causing leakage to make it possible to intermittently output an oscillation signal.

In order to achieve the above-described object, according to a first aspect of the present invention, there is provided a radar oscillator comprising: an oscillation unit (21) having an amplifier (22), an LC resonator (23) which is connected to the amplifier, has at least an inductance component and a capacitance component, and resonates at a predetermined resonant frequency, and a feedback circuit (24) which performs positive feedback from an output side of the amplifier to an input side of the amplifier, the oscillation unit outputting an oscillation signal having a frequency determined by the resonant frequency of the LC resonator; a first switch circuit (30) which is connected to a power supply unit (Ve) to the amplifier of the oscillation unit, which turns off an electric power supply by the power supply unit to the amplifier in a period in which a pulse signal representing a transmitting period for transmitting the oscillation signal as a transmitting radar signal is not input to set the oscillation unit in a non-oscillation state, and which turns on the electric power supply by the power supply unit to the amplifier in a period in which the pulse signal is input to set the oscillation unit in an oscillation state; and a second switch circuit (40) which is connected to the power supply unit (Ve) to the LC resonator of the oscillation unit, which turns on the electric power supply by the power supply unit (Ve) to the LC resonator in a predetermined period immediately before the pulse signal is input in a period in which the pulse signal is not input to supply a predetermined current to the LC resonator, and which turns off the electric power supply by the power supply unit (Ve) to the LC resonator at a timing at which the pulse signal is input to stop the supply of the predetermined current to the LC resonator, so that activation of an oscillation operation of the oscillation unit is accelerated.

In order to achieve the above-described object, according to a second aspect of the present invention, there is provided the radar oscillator according to the first aspect, wherein the LC resonator is formed by a parallel resonant circuit constituted by a coil (L1) and a capacitor (C1).

In order to achieve the above-described object, according to a third aspect of the present invention, there is provided the radar oscillator according to the second aspect, wherein the coil has an intermediate tap, and a buffer connected to the intermediate tap of the coil is arranged in the feedback circuit.

In order to achieve the above-described object, according to a fourth aspect of the present invention, there is provided the radar oscillator according to the first aspect, wherein the LC resonator is formed by a $\lambda/4$ transmission path.

In order to achieve the above-described object, according to a fifth aspect of the present invention, there is provided the radar oscillator according to the first aspect, wherein the LC resonator includes first and second LC resonators (23a, 23b) formed by parallel resonant circuits constituted by coils (L1, L2) and capacitors (C1, C2), respectively, the amplifier includes a first transistor (Q1) connected from a collector thereof to the first LC resonator (23a), and the feedback circuit includes a second transistor (Q2) connected from a collector thereof to the second LC resonator (23b), a signal output from the collector of the first transistor or the first LC resonator is received by a base of the second transistor, and a signal output from the collector of the second transistor or the second LC resonator is input to a base of the first transistor.

In order to achieve the above-described object, according to a sixth aspect of the present invention, there is provided the radar oscillator according to the fifth aspect, wherein the coils of the first and second LC resonators have intermediate taps, respectively, and first and second buffers connected between the intermediate taps of the coils and the bases of the first and second transistors, respectively, are arranged in the feedback circuit.

In order to achieve the above-described object, according to a seventh aspect of the present invention, there is provided the radar oscillator according to the fifth aspect, wherein the first and second LC resonators are formed by $\lambda/4$ transmission paths, respectively.

In order to achieve the above-described object, according to an eighth aspect of the present invention, there is provided the radar oscillator according to the fifth aspect, comprising a third switch circuit (50) which connects between output terminals of the first and second LC resonators to each other until a predetermined period of time has elapsed after inputting of the pulse signal is stopped, thereby accelerating convergence of the oscillation signal.

In order to achieve the above-described object, according to a ninth aspect of the present invention, there is provided the radar oscillator according to the sixth aspect, comprising a third switch circuit (50) which connects between output terminals of the first and second LC resonators to each other until a predetermined period of time has elapsed after inputting of the pulse signal is stopped, thereby accelerating convergence of the oscillation signal.

In order to achieve the above-described object, according to a tenth aspect of the present invention, there is provided the radar oscillator according to the seventh aspect, comprising a third switch circuit (50) which connects between output terminals of the first and second LC resonators to each other until a predetermined period of time has elapsed after inputting of the pulse signal is stopped, thereby accelerating convergence of the oscillation signal.

In a radar oscillator according to the present invention constituted as described above, the first switch circuit turns off an electric power supply from an electric power supply unit to an amplifier in a period in which a pulse signal representing a transmitting period for transmitting a radiowave as a transmitting radar signal is not input to set the oscillation unit in a non-oscillation state and turns on the electric power supply from the electric power supply unit to the amplifier in a period in which the pulse signal is input to set the oscillation unit in an oscillation state, so that leakage is not theoretically caused.

In the radar oscillator according to the present invention, the second switch circuit turns on an electric power supply from an electric power supply unit to an LC resonator in a predetermined period immediately before the pulse signal is input in a period in which the pulse signal is not input, thereby supplying predetermined electric power to the LC resonator and turns off the electric power supply from the electric power supply unit to the LC resonator at a timing at which the pulse signal is input, thereby abruptly stopping supplying the predetermined electric power to the LC resonator, so that the LC resonator is excited by a transient phenomenon at a resonant frequency to accelerate activation of an oscillation operation of the oscillation unit in order to speedily shift to an oscillation state.

In the radar oscillator according to the present invention having first and second LC oscillators, the radar oscillator having a third switch circuit which connects output terminals of the first LC resonator and the second LC resonator to each other in a predetermined period of time after inputting of a pulse signal is stopped is arranged, signals generated by the first LC resonator and the second LC resonator and having phases inverted to each other after the inputting of the pulse signal is stopped are synthesized with each other to cancel the signals and accelerate convergence of the oscillation signals to immediately make it possible to converge the oscillation signals.

BRIEF DESCRIPTION OF DRAWINGS

FIG. 8 is a block diagram shown to explain a configuration of a radar oscillator according to a fifth embodiment of the present invention.

BEST MODE FOR CARRYING OUT THE INVENTION

Several embodiments of the present invention will be described below with reference to the accompanying drawings.

First Embodiment

Figure 1:
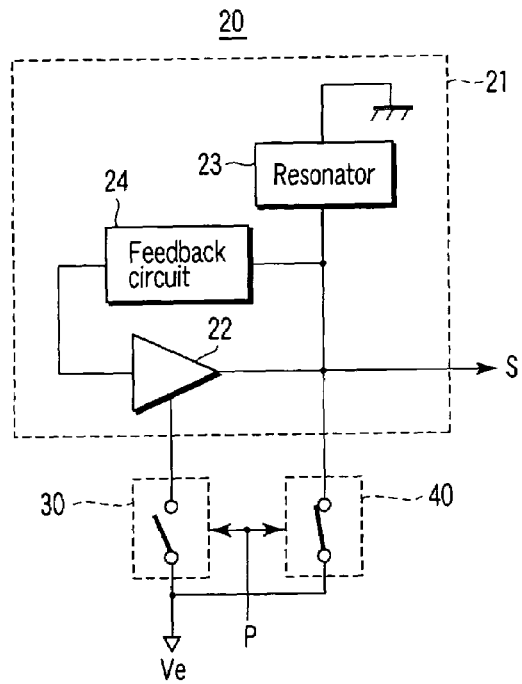
FIG. 1 is a block diagram shown to explain a configuration of a radar oscillator according to a first embodiment of the present invention.

FIG. 1 is a block diagram shown to explain a configuration of a radar oscillator 20 according to a first embodiment to which the present invention is applied.

The radar oscillator 20 basically includes: an oscillation unit 21 which has an amplifier 22, an LC resonator 23 which is connected to the amplifier 22, has at least an inductance component and a capacitance component, and resonates at a predetermined resonant frequency, and a feedback circuit 24 which performs positive feedback from an output side of the amplifier 22 to an input side of the amplifier 22, and which outputs an oscillation signal having a frequency determined by the resonant frequency of the LC resonator 23; a first switch circuit 30 which is connected to a power supply unit Ve to the amplifier 22 of the oscillation unit 21, which turns off an electric power supply by the power supply unit Ve to the amplifier 22 in a period in which a pulse signal representing a transmitting period for transmitting the oscillation signal as a transmitting radar signal is not input to set the oscillation unit 21 in a non-oscillation state, and which turns on the electric power supply by the power supply unit Ve to the amplifier 22 in a period in which the pulse signal is input to set the oscillation unit 21 in an oscillation state; and a second switch circuit 40 which is connected to the power supply unit Ve to the LC resonator 23 of the oscillation unit 21, which turns on the electric power supply by the power supply unit Ve to the LC resonator 23 in a predetermined period immediately before the pulse signal is input in a period in which the pulse signal is not input to supply a predetermined current to the LC resonator 23 and which turns off the electric power supply by the power supply unit Ve to the LC resonator 23 at a timing at which the pulse signal is input to stop the supply of the predetermined current to the LC resonator 23, so that activation of an oscillation operation of the oscillation unit 21 is accelerated.

The radar oscillator 20 is, more specifically, constituted by the oscillation unit 21 and the first switch circuit 30 and the second switch circuit 40 connected to the oscillation unit 21.

The oscillation unit 21 is constituted by the amplifier 22, the LC resonator 23 connected as a load of the amplifier 22 and having at least inductance component and a capacitance component to resonate at a predetermined resonant frequency, and the feedback circuit 24 which performs positive feedback of an output from the amplifier 22 to an input side of the amplifier 22 to output an oscillation signal S having a frequency determined by the resonant frequency of the LC resonator 23 from the oscillation unit 21.

In this case, the amplifier 22 may be of any one of an inverting phase type and a non-inverting phase type. The feedback circuit 24 may be constituted by any one of the inverting phase type of amplifier 22 or the non-inverting phase type of amplifier 22.

For example, when the amplifier 22 is of the inverting type, the inverting type feedback circuit 24 is used to make it possible to perform positive feedback.

When the amplifier 22 is of the non-inverting phase type, the non-inverting phase type of feedback circuit 24 is used to make it possible to perform positive feedback.

The feedback circuit 24 may be simply constituted by a capacitor (or a stray capacitor generated between the input and the output of the amplifier 22), a coil, and the like, or may be constituted by an amplification circuit.

On the other hand, the first switch circuit 30 switches an operation state of the amplifier 22 of the oscillation unit 21 between an oscillation state and a non-oscillation state depending on a level of a pulse signal P representing a transmitting period to transmit the oscillation signal from the oscillation unit 21 as a transmitting radar signal.

The first switch circuit 30 is connected to the power supply unit Ve to the amplifier 22, turns off an electric power supply by the power supply unit Ve to the amplifier 22 in a period in which the pulse signal P is not input to set the oscillation unit 21 in the non-oscillation state, and turns on the electric power supply by the power supply unit Ve to the amplifier 22 in a period in which the pulse signal P is input to set the oscillation unit 21 in the oscillation state.

As described above, the scheme of controlling the power supply unit Ve to the amplifier 22 of the oscillation unit 21 to switch oscillation states is a scheme which can most reliably prevent leakage, and can minimize a power consumption. For this reason, one can say that the scheme is optimum for a UWB radar which requires low power consumption.

However, in the scheme, time is required until the oscillation unit 21 is set in the oscillation state when a power is supplied to the oscillation unit 21.

For example, in a UWB radar using a pulse signal P having a narrow bandwidth of 1 ns, the oscillation unit 21 must be switched to the oscillation state within time which is sufficiently shorter than the pulse width.

Therefore, the radar oscillator 20 uses, for example, the second switch circuit 40 which performs an opening/closing operation at timings opposite to the timings of the first switch circuit 30.

In this manner, in a period in which the pulse signal P is not input, the second switch circuit 40 is turned on to flow a predetermined current into the LC resonator 23, the second switch circuit 40 is turned off at a timing at which the pulse signal P is input to suddenly stop electric power supply to the LC resonator 23, so that activation of the oscillation operation of the oscillation unit 21 can be accelerated.

More specifically, when the second switch circuit 40 opens to stop the power supply to the LC resonator 23, a signal which attenuate-vibrate at a resonant frequency of the LC resonator 23 is generated by a transient phenomenon by a large counter electromotive force mainly generated in an inductance component of the LC resonator 23. The attenuate-vibrated signal is input to the amplifier 22 through the feedback circuit 24 to accelerate activation of the oscillation operation of the oscillation unit 21.

Figure 2:
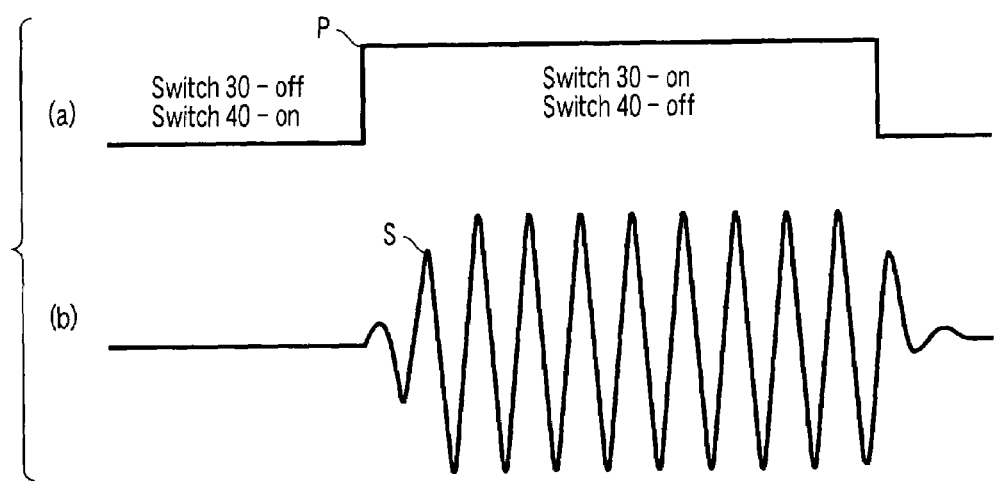
FIG. 2 is a response characteristic diagram shown to explain an operation of the radar oscillator in FIG. 1.

Therefore, for example, at a rising timing of the pulse signal P as shown in FIG. 2A, the oscillation signal S which rises with little delay can be obtained from the oscillation unit 21 as shown in FIG. 2B.

In this case, as shown in FIG. 2A, in place of a pulse signal P having a positive logic in which an input state of the pulse signal P corresponds to a high level and a non-input state of the pulse signal P corresponds to a low level, a pulse signal having a negative logic in which a non-input state of the pulse signal P corresponds to a high level and an input state of the pulse signal P corresponds to a low level may be used.

When an oscillation frequency becomes unstable due to a decrease in Q of the LC resonator 23, the LC resonator 23 and the feedback circuit 24 may be connected to each other through a buffer such as an emitter-follower having a high input impedance, or the oscillation signal S may be output through the buffer.

Second Embodiment

Figure 3:
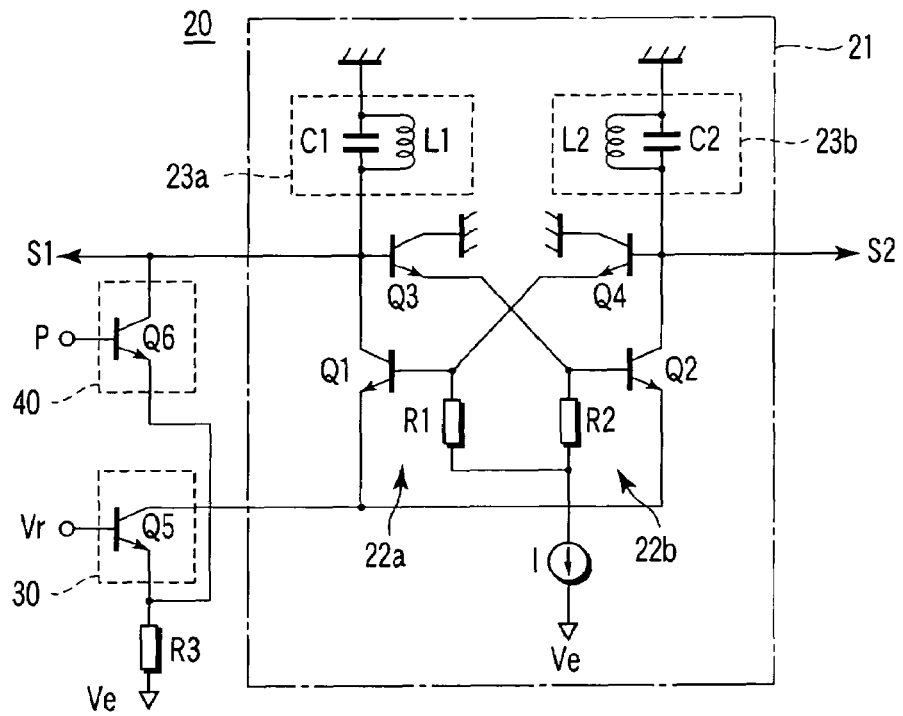
FIG. 3 is a block diagram shown to explain a configuration of a radar oscillator according to a second embodiment of the present invention.

FIG. 3 is a block diagram shown to explain a configuration of a radar oscillator according to a second embodiment to which the present invention is applied.

The configuration in FIG. 3 to which the second embodiment is applied shows a more concrete circuit example of a radar oscillator 20 which receives a pulse signal P having a negative logic.

An oscillation unit 21 of the radar oscillator 20 in FIG. 3 includes a first amplifier 22a constituted by a first LC resonator 23a formed by a parallel connection between a coil L1 and a capacitor C1, a first transistor Q1 using the first LC resonator 23a as a load, and a base resistor R1 of the first transistor Q1.

The oscillation unit 21 of the radar oscillator 20 has a second amplifier 22b constituted by a second LC fresonator 23b formed by a parallel connection between a coil L2 and a capacitor C2, a transistor Q2 using the second LC resonator 23b as a load, and a base resistor R2 of the transistor Q2.

In this case, a collector (output of the amplifier 22a) of the transistor Q1 and a base (input of the amplifier 22b) of the transistor Q2 are connected through an emitter-follower constituted by a transistor Q3 serving as a buffer.

A collector (output of the second amplifier 22b) of the transistor Q2 and a base (input of the amplifier 22a) of the transistor Q1 are connected through an emitter-follower constituted by a transistor Q4 serving as a buffer.

The base resistors R1 and R2 of both the transistors Q1 and Q2 are connected to a power supply unit (negative power supply) Ve, respectively.

Emitters of both the transistors Q1 and Q2 are connected to the power supply unit (negative power supply) Ve through a transistor Q5 constituting the first switch circuit 30 and a resistor R3.

The oscillation unit 21 is an oscillator which is alternately turned on and off by the transistors Q1 and Q2 to intermit an oscillation operation. When the first amplifier 22a serving as one amplifier is used as a main amplifier, the second amplifier 22b serving as the other amplifier constitutes a feedback circuit 24 to perform inverse amplification of an output from the amplifier 22a by the amplifier 22b to perform positive feedback the output to an input side of the amplifier 22a.

As the alternative view, it can be considered that the oscillation unit 21 is an oscillator which is designed by cascade-connecting identical type of two amplification circuits (22a and 22b) each having the LC resonators 23a and 23b as loads, and an output signal from the circuits feeds back positively to an input.

When the first switch circuit 30 is set in an on (closed) state, electric power is supplied to the transistors Q1 and Q2, and the oscillation unit 21 is set in an oscillation state at resonant frequencies (which are set to be equal to each other) of the LC resonators 23a and 23b.

The oscillation unit 21 having this configuration can output two-phase oscillation signals S1 and S2 the phases of which are inverted to each other.

Emitter-follower buffers constituted by the transistors Q3 and Q4 are inserted to prevent Q of the LC resonators 23a and 23b from being decreased.

Therefore, when the decrease in Q does not cause any problem, the emitter-follower buffers constituted by the transistors Q3 and Q4 are omitted to make it possible to directly connect the transistors Q1 and Q2 to each other.

As another configuration, the transistors Q1 and Q2 are connected to each other through a capacitor in place of the buffers.

The first switch circuit 30 of this circuit example is constituted by the transistor Q5.

A collector of the transistor Q5 is connected to the emitters of the transistors Q1 and Q2, and an emitter of the transistor Q5 is connected to the power supply unit (negative power supply) Ve through the resistor R3. Further, a reference voltage Vr is input to a base of the transistor Q5.

The second switch circuit 40 is constituted by a transistor Q6.

A collector of the transistor Q6 is connected to the resonator 23a serving as one resonator, and an emitter of the transistor Q6 is connected to the emitter of the transistor Q6. A pulse signal P is input to a base of the transistor Q6.

In this case, the reference voltage Vr is an intermediate voltage between a high level and a low level of the pulse signal P. For example, the reference voltage Vr is set to be higher than a voltage of the power supply unit (negative power supply) Ve by about 1 volt and set to be lower than a voltage obtained by adding a voltage drop (0.6 to 0.7 V) Vbe between base-emitter of the transistor Q6 to a voltage of a node between the emitter of the transistor Q6 and the resistor R3 when the pulse signal P goes to high level to turn on the transistor Q6.

Therefore, when the pulse signal P is set at a high level (non-input state of the pulse signal P), the transistor Q5 of the first switch circuit 30 is turned off, and the transistor Q6 of the second switch circuit 40 is turned on.

For this reason, in the non-input state of the pulse signal P, a power supply voltage from the power supply unit (negative power supply) Ve is not applied to the transistors Q1 and Q2 of the oscillation unit 21 to set the oscillation unit 21 in a non-oscillation state, and a predetermined current flows into the first LC resonator 23a through the transistor Q6.

When the pulse signal P goes low (input state of the pulse signal P), the transistor Q5 of the first switch circuit 30 is turned on, and the transistor Q6 of the second switch circuit 40 is turned off.

For this reason, in the input state of the pulse signal P, the oscillation unit 21 is set in an oscillation state, and a current supply to the first LC resonator 23a is suddenly stopped. Thus, due to the transient phenomenon described above, rapid activation of the oscillation operation is accelerated.

When a pulse signal having a positive logic is used in place of the pulse signal P having a negative logic as in the above circuit, the pulse signal P may be input to the base of the transistor Q5, and the reference voltage Vr may be input to the base of the transistor Q6.

When a pulse signal having a positive logic is used in place of the pulse signal P having a negative logic as in the above circuit, the emitters of the transistors Q5 and Q6 may be independently connected to the power supply unit (negative power supply) Ve, the pulse signal P having the positive logic may be input to the base of the transistor Q5, and a signal obtained by inverting the pulse signal P may be input to the base of the transistor Q6.

Third Embodiment

Figure 4:
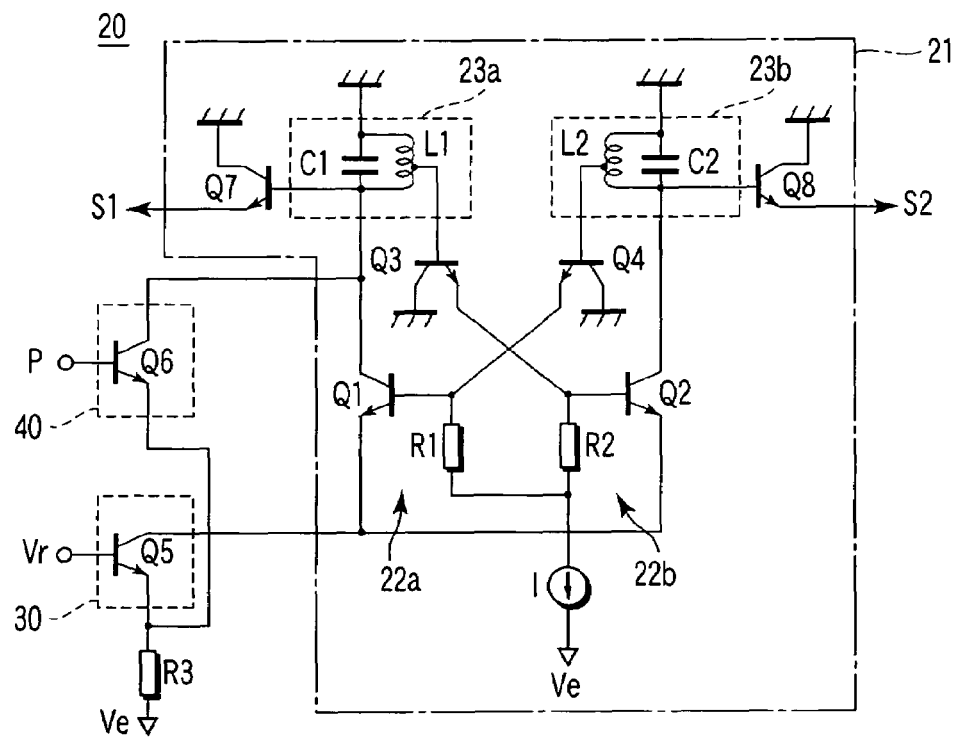
FIG. 4 is a block diagram shown to explain a configuration of a radar oscillator according to a third embodiment of the present invention.

FIG. 4 is a block diagram shown to explain a configuration of a radar oscillator according to a third embodiment to which the present invention is applied.

In FIG. 4, the same reference numerals as in FIG. 3 denote the same parts as in the radar oscillator according to the second embodiment shown in FIG. 3, and a description thereof will be omitted.

FIG. 4 shows, as a radar oscillator according to the third embodiment to which the present invention is applied, an example in which bases of transistors Q3 and Q4 constituting buffers are connected to intermediate taps of coils L1 and L2 of first and second LC resonators 23a and 23b, respectively, to further increase Q of the first and second LC resonators 23a and 23b, and transistors Q7 and Q8 (a power supply circuit for these transistors is omitted in the drawing) are arranged as output buffers.

Figure 5:
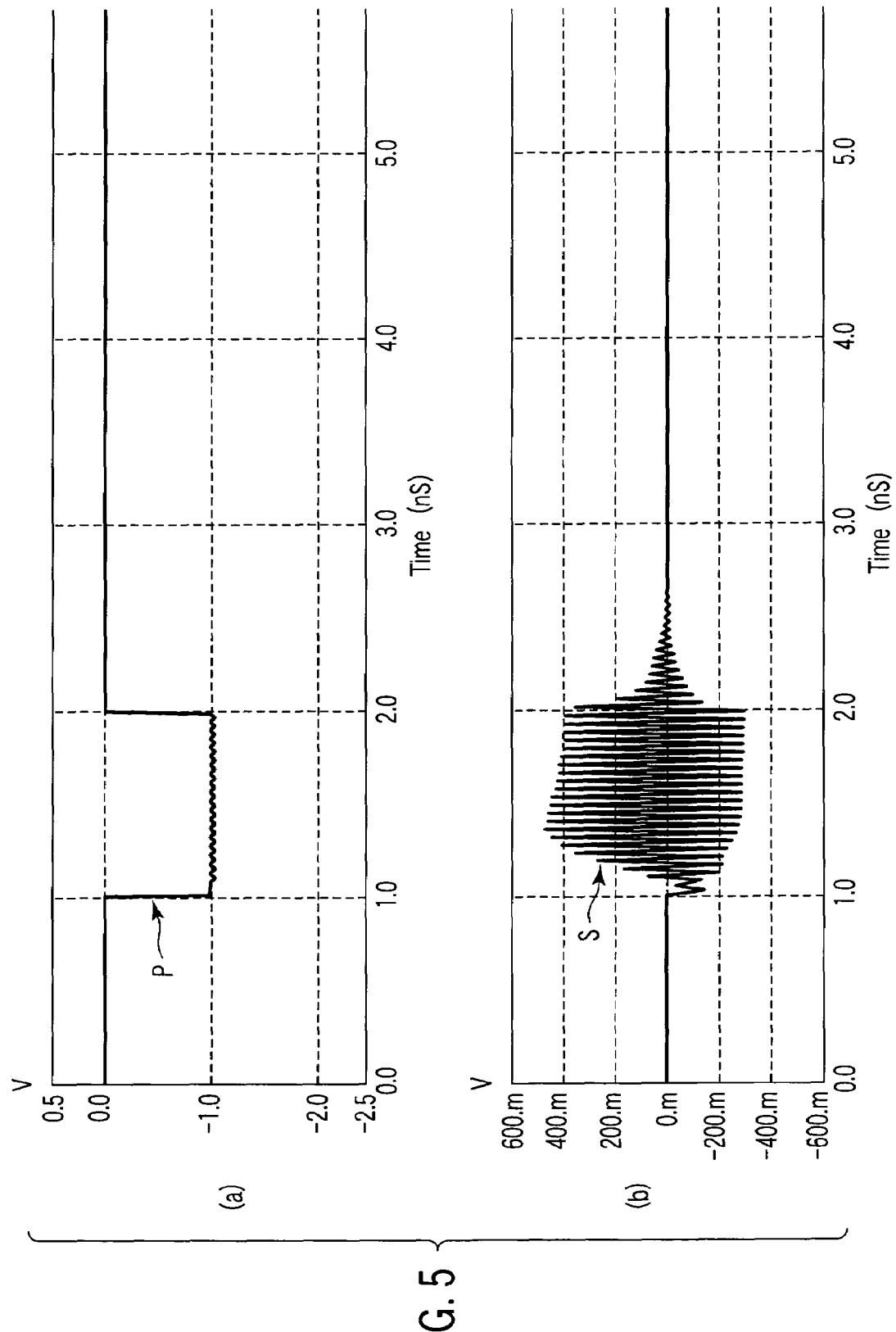
FIG. 5 is a response characteristic diagram shown to explain an operation of the radar oscillator in FIG. 4.

FIG. 5 is a characteristic diagram showing response characteristics (simulation result) of the radar oscillator according to the third embodiment shown in FIG. 4.

It can be seen that, to a falling edge (indicated by a negative logic) of the pulse signal P having a bandwidth of 1 nS as shown in FIG. 5A, an oscillation signal S responds as shown in FIG. 5B and reaches a sufficient level within almost 0.3 ns.

Fourth Embodiment

Figure 6:
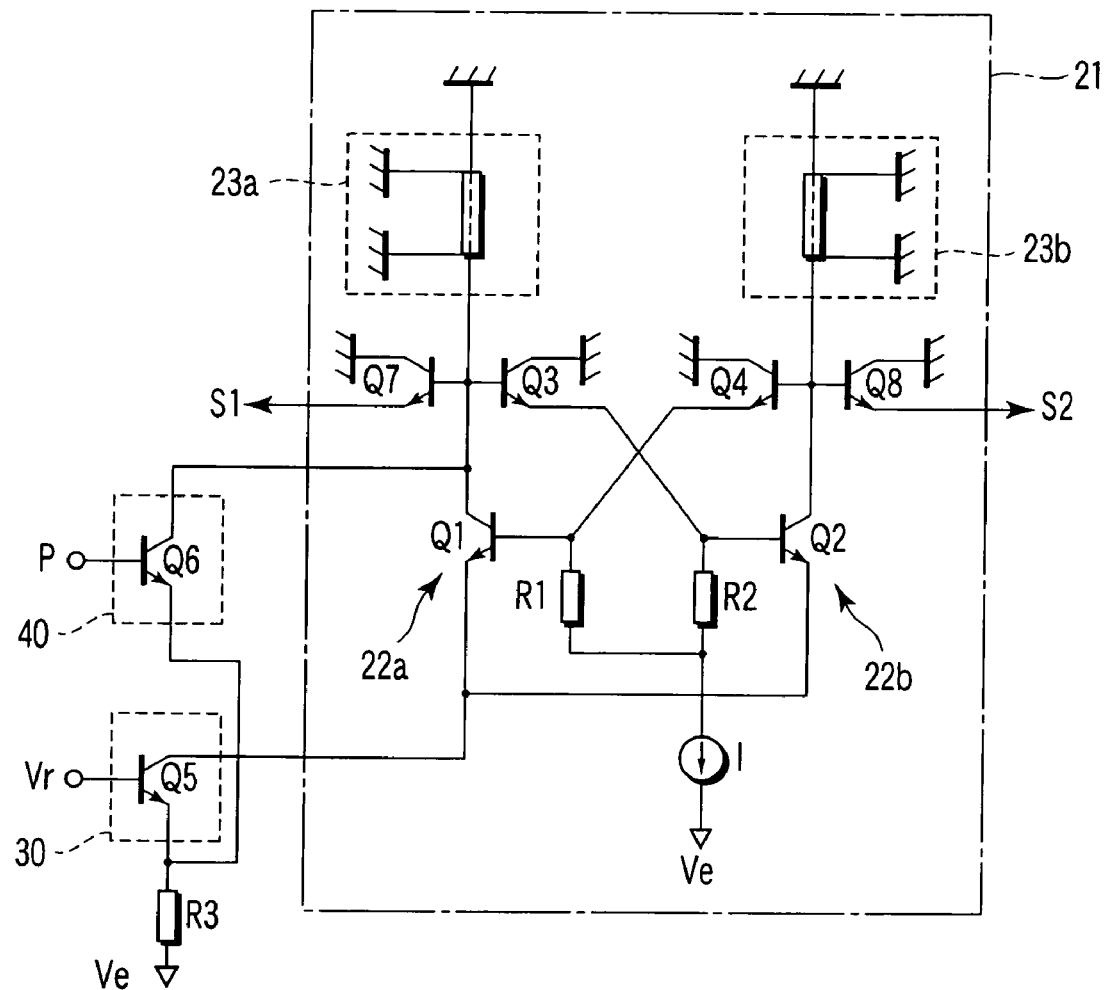
FIG. 6 is a block diagram shown to explain a configuration of a radar oscillator according to a fourth embodiment of the present invention.

FIG. 6 is a block diagram shown to explain a configuration of a radar oscillator according to a fourth embodiment to which the present invention is applied.

In FIG. 6, the same reference numerals as in FIGS. 3 and 4 denote the same parts as in the radar oscillators according to the second and third embodiments shown in FIGS. 3 and 4, and a description thereof will be omitted.

FIG. 6 shows, as the radar oscillator according to the fourth embodiment to which the present invention is applied, an example in which, a resonant function of a λ/4 transmission path (for example, a coplanar line) is used as the first and second LC resonators 23a and 23b.

Figure 7:
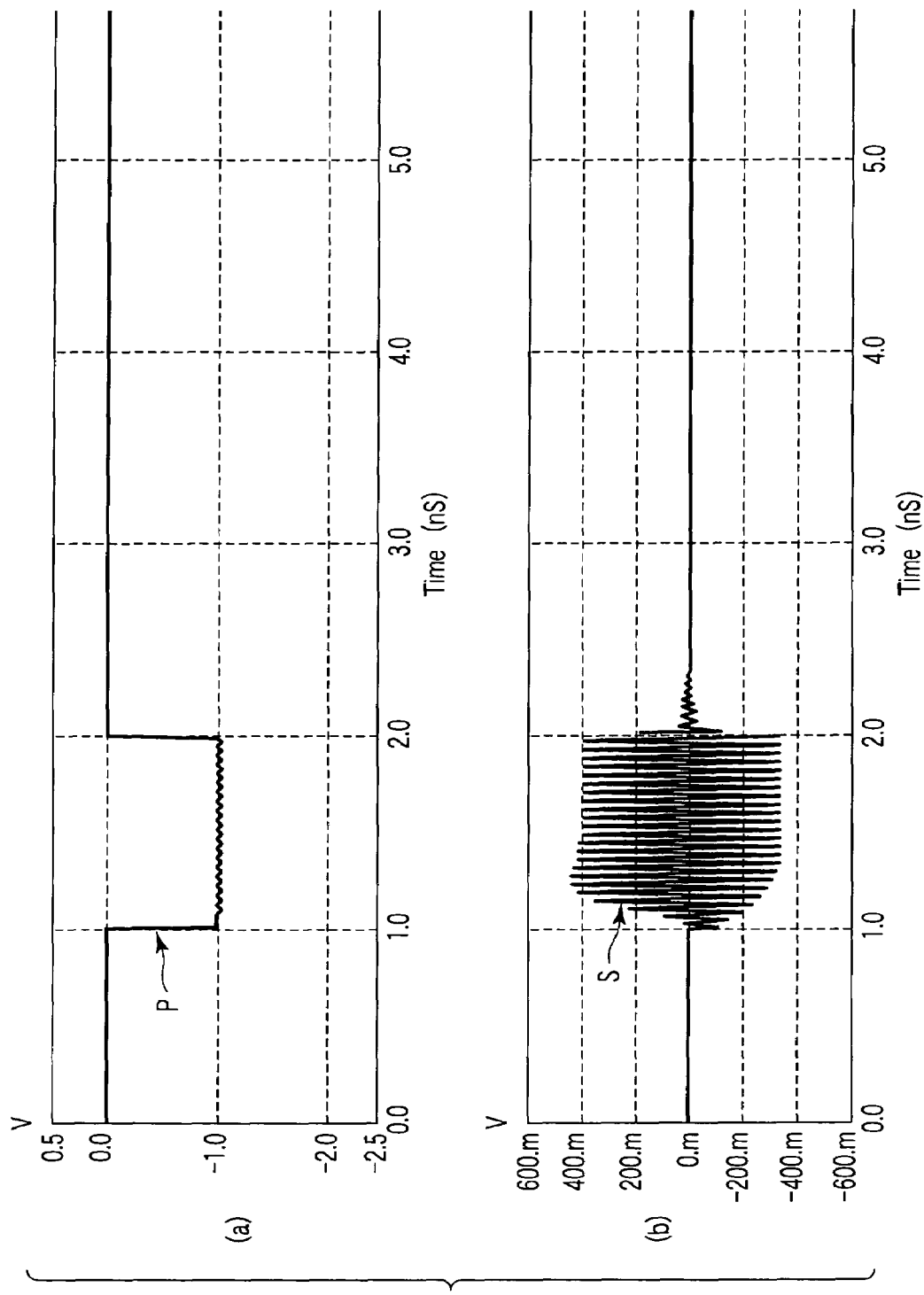
FIG. 7 is a response characteristic diagram shown to explain an operation of the radar oscillator in FIG. 6.

FIG. 7 is a characteristic diagram showing response characteristics (simulation result) of the radar oscillator according to the fourth embodiment shown in FIG. 6.

As shown in FIG. 7A, to a falling edge of the pulse signal P having a bandwidth of 1 ns, an oscillation signal S immediately responds and reaches a sufficient level within almost 0.2 ns.

In this manner, in the radar oscillators according to the embodiments to which the present invention is applied, a power supply to the oscillation unit 21 is on/off-controlled to output a burst-shaped signal, and a current is flowed into the LC resonator when the power supply is stopped, and the power supply to the LC resonator is stopped when the power supply is started, so that a response speed of an oscillation signal to a pulse can be made very high. Furthermore, the radar oscillators do not theoretically cause leakage and are suitable for a UWB radar which requires low power consumption.

Since the radar oscillators according to the embodiments to which the present invention is applied do not theoretically cause leakage, a spectrum can be arranged at a position which is sufficiently far from the RR radiowave emission prohibited band among UWB to make it possible to contribute to realization of a UWB radar system which conforms to recommendations from the FCC.

Fifth Embodiment

FIG. 8 is a block diagram shown to explain a configuration of a radar oscillator according to a fifth embodiment to which the present invention is applied.

In FIG. 8, the same reference numerals as in FIGS. 3, 4, and 6 denote the same parts as in the radar oscillators according to the second, third, and fourth embodiments shown in FIGS. 3, 4, and 6, and a description thereof will be omitted.

In the radar oscillator according to the fifth embodiment to which the present invention is applied, in the circuits according to the above embodiments, a configuration shown in FIG. 8 is employed in place of the configuration in which a current is flowed into the LC resonator 23a serving as one LC resonator when an oscillation operation is stopped, and the current supply is stopped to accelerate activation of the oscillation operation of the oscillation unit 21.

More specifically, as shown in FIG. 8, in the radar oscillator according to the fifth embodiment to which the present invention is applied, transistors Q9 and Q10 and a resistor R4 are added to a second switch circuit 40.

The current supply to the first LC resonator 23a is stopped at a timing at which a pulse signal P having a negative logic is input to the second switch circuit 40, and a current is supplied to a second LC resonator 23b to cause the first and second LC resonators 23a and 23b to generate signals inverted relative to each other. The oscillation unit 21 is accelerated to further increase a speed of activation of an oscillation operation.

Since the circuits according to the above embodiments are constituted by simple switches which are turned on/off depending on levels of one pulse signal P, a predetermined current is flowed into the LC resonators in a period in which electric power supply to the oscillation unit 21 is stopped.

However, as the period in which a current is flowed into the LC resonators, a partial period immediately before the power supply is started may be set in a power supply stop period for the oscillation unit 21.

In this case, another pulse signal having a phase different from that of the pulse signal P is used, and the other pulse signal is given to the second switch circuit 40 to control a current supply to the LC resonators, so that the oscillation operation of the oscillation unit 21 is activated.

In the above embodiments, the current supply to the LC resonator is suddenly stopped, and activation of the oscillation operation of the oscillation unit 21 is accelerated to cause an oscillation signal to rapidly rise.

However, in an oscillator using an LC resonator having high Q, an oscillation signal is not immediately converged after an electric power supply to the oscillation unit 21 is stopped, and a falling edge of the oscillation signal leaves traces. Therefore, output time of the oscillation signal may be disadvantageously longer than a predetermined pulse width.

As one method of solving this problem, the LC resonator may be short-circuited.

In this case, both the ends of the LC resonator may be short-circuited in only a predetermined period immediately after the electric power supply to the oscillation unit 21 is stopped, and a current may be flowed into the LC resonator immediately before electric power supply is started after the predetermined period to accelerate activation of an oscillation operation of the oscillation unit 21.

Sixth Embodiment

Figure 9:
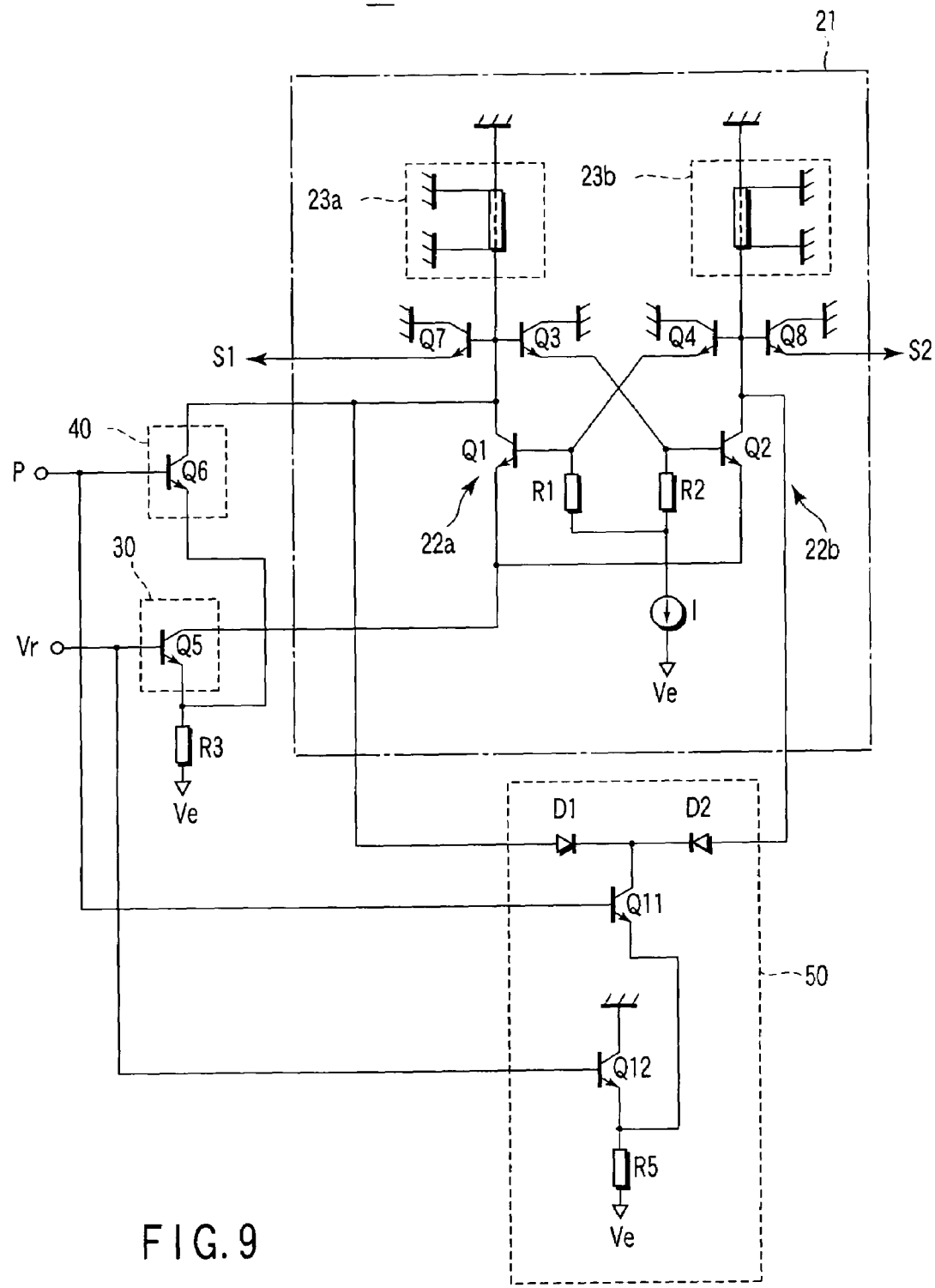
FIG. 9 is a block diagram shown to explain a configuration of a radar oscillator according to a sixth embodiment of the present invention.
Figure 10:
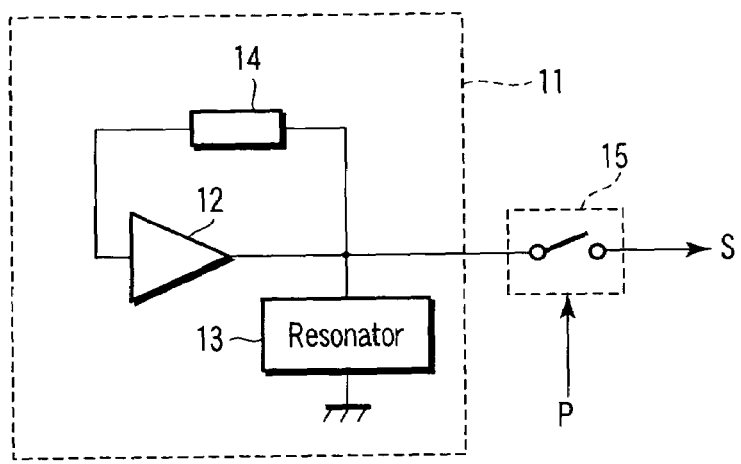
FIG. 10 is a block diagram shown to explain a configuration of a conventional radar oscillator.
Figure 11:
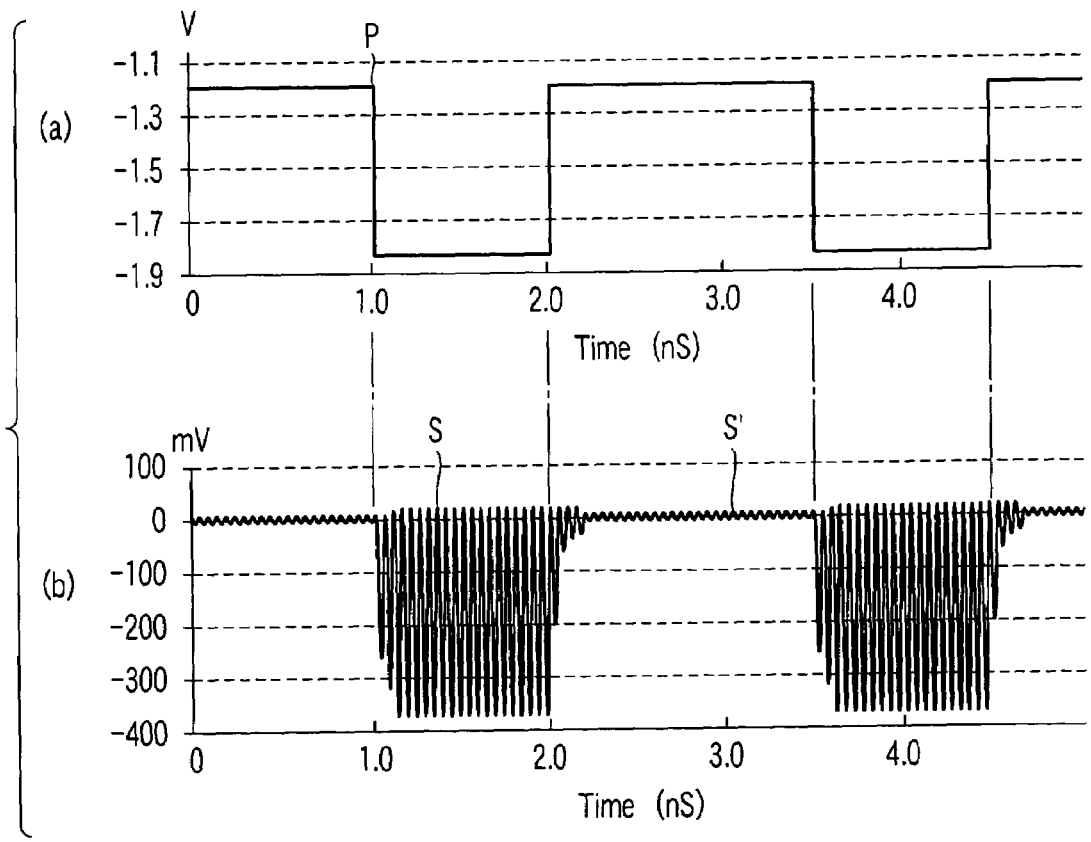
FIG. 11 is a characteristic diagram shown to explain a spectrum of an output signal from the conventional radar oscillator.
Figure 12:
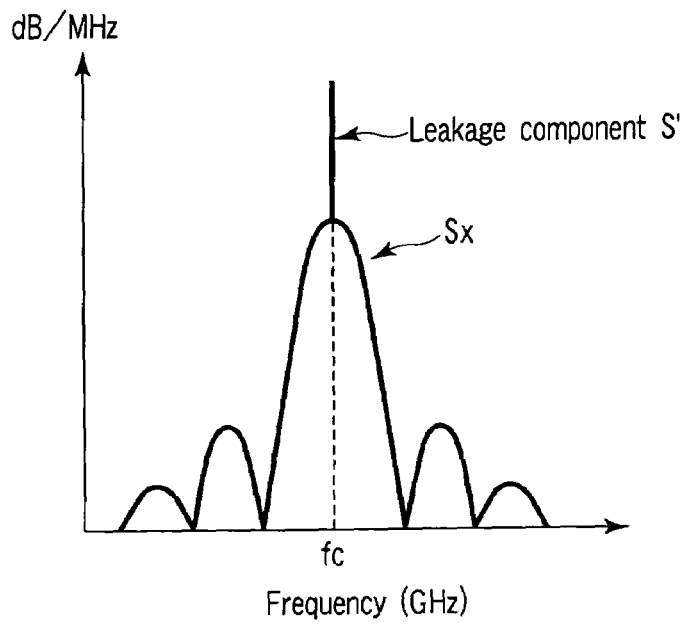
FIG. 12 is a characteristic diagram shown to explain a spectrum of an output signal from the conventional radar oscillator.
Figure 13:
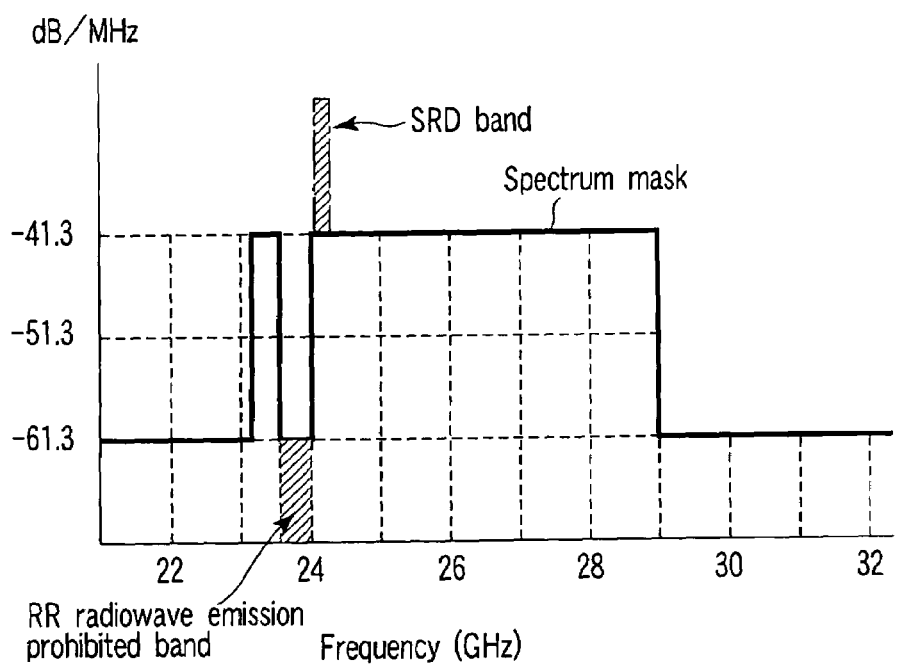
FIG. 13 is a diagram for explaining a spectrum mask of a UWB radar.

FIG. 9 is a block diagram shown to explain a configuration of a radar oscillator according to a sixth embodiment to which the present invention is applied.

In FIG. 9, the same reference numerals as in FIGS. 3, 4, 6, and 8 denote the same parts as in the radar oscillators according to the second, third, fourth, and fifth embodiments shown in FIGS. 3, 4, 6, and 8, and a description thereof will be omitted.

The radar oscillator according to the sixth embodiment to which the present invention is applied has first and second LC resonators 23a and 23b like the circuits described above. When an oscillation unit 21 having a configuration which outputs oscillation signals having two phases inverted relative to each other is used, output terminals of the first and second LC resonators are connected to each other when electric power supply to the oscillation unit 21 is stopped, and residues of the oscillation signals of two phases are canceled out.

More specifically, as shown in FIG. 9, in the radar oscillator according to the sixth embodiment to which the present invention is applied, there is arranged a third switch circuit 50 constituted by diodes D1 and D2, transistors Q11 and Q12, and a resistor R4 which are connected in opposite directions between output terminals of the first and second LC resonators 23a and 23b.

The transistor Q11 is turned on when inputting of a pulse signal P having a negative logic to the third switch circuit 50 is stopped to turn on the diodes D1 and D2.

In this manner, the output terminals of the first and second LC resonators 23a and 23b are short-circuited in an alternating-current manner to cancel out residues of the inverted oscillation signals appearing at both the output terminals after the electric power supply is stopped, so that the residues of the oscillation signals of two phases are rapidly converged.

In the radar oscillator 20, when the pulse signal P is at a low level (pulse input period), the transistor Q11 and the diodes D1 and D2 are turned off. For this reason, the third switch circuit 50 does not affect the oscillation operation at all.

When both the third switch circuit 50 and the second switch circuit 40 are used, the oscillation unit 21 starts oscillation before the input timing of the pulse signal P, and a burst-shaped oscillation signal which is converged before an input stop timing can be obtained.

As in the circuits described above, the present invention can be similarly applied to a radar oscillator having a configuration in which an oscillation operation is performed by using one LC resonator in place of two LC resonators.

Therefore, according to the present invention as described above, there can be provided a radar oscillator which solves the problems of the conventional art and increases a response speed to a pulse signal representing a transmission timing of a transmitting radar signal without causing leakage to make it possible to intermittently output an oscillation signal.

The invention claimed is:

1. A radar oscillator comprising:
an oscillation unit comprising: (i) an amplifier, (ii) an LC resonator which is connected to the amplifier, has at least an inductance component and a capacitance component, and resonates at a predetermined resonant frequency, and (iii) a feedback circuit which performs positive feedback from an output side of the amplifier to an input side of the amplifier, the oscillation unit outputting an oscillation signal having a frequency determined by the resonant frequency of the LC resonator;
a first switch circuit which is connected to a power supply unit and to the amplifier of the oscillation unit, and which turns off an electric power supply by the power supply unit to the amplifier in a period in which a pulse signal representing a transmitting period for transmitting the oscillation signal as a transmitting radar signal is not input to set the oscillation unit in a non-oscillation state, and turns on the electric power supply by the power supply unit to the amplifier in a period in which the pulse signal is input to set the oscillation unit in an oscillation state; and
a second switch circuit which is connected to the power supply unit and to the LC resonator of the oscillation unit, and which turns on the electric power supply by the power supply unit to the LC resonator in a predetermined period immediately before the pulse signal is input in a period in which the pulse signal is not input to supply a predetermined current to the LC resonator, and turns off the electric power supply by the power supply unit to the LC resonator at a timing at which the pulse signal is input to stop the supply of the predetermined current to the LC resonator, so that activation of an oscillation operation of the oscillation unit is accelerated;
wherein the LC resonator is formed by a parallel resonant circuit constituted by a coil and a capacitor; and
wherein the coil has an intermediate tap and the feedback circuit includes a buffer connected to the intermediate tap of the coil.

2. The radar oscillator according to claim 1, wherein the LC resonator is formed by a $\lambda/4$ transmission path.

3. A radar oscillator comprising:
an oscillation unit comprising: (i) an amplifier, (ii) an LC resonator which is connected to the amplifier, has at least an inductance component and a capacitance component, and resonates at a predetermined resonant frequency, and (iii) a feedback circuit which performs positive feedback from an output side of the amplifier to an input side of the amplifier, the oscillation unit outputting an oscillation signal having a frequency determined by the resonant frequency of the LC resonator;
a first switch circuit which is connected to a power supply unit and to the amplifier of the oscillation unit, and which turns off an electric power supply by the power supply unit to the amplifier in a period in which a pulse signal representing a transmitting period for transmitting the oscillation signal as a transmitting radar signal is not input to set the oscillation unit in a non-oscillation state, and turns on the electric power supply by the power supply unit to the amplifier in a period in which the pulse signal is input to set the oscillation unit in an oscillation state; and
a second switch circuit which is connected to the power supply unit and to the LC resonator of the oscillation unit, and which turns on the electric power supply by the power supply unit to the LC resonator in a predetermined period immediately before the pulse signal is input in a period in which the pulse signal is not input to supply a predetermined current to the LC resonator, and turns off the electric power supply by the power supply unit to the LC resonator at a timing at which the pulse signal is input to stop the supply of the predetermined current to the LC resonator, so that activation of an oscillation operation of the oscillation unit is accelerated;

wherein:
- the LC resonator includes first and second LC resonators formed by parallel resonant circuits, respectively, each of the parallel resonant circuits being constituted by a coil and a capacitor,
- the amplifier includes a first transistor connected from a collector thereof to the first LC resonator,
- the feedback circuit includes a second transistor connected from a collector thereof to the second LC resonator,
- a signal output from the collector of the first transistor or the first LC resonator is received by a base of the second transistor, and
- a signal output from the collector of the second transistor or the second LC resonator is input to a base of the first transistor.

4. The radar oscillator according to claim 3, wherein the coils of the first and second LC resonators have intermediate taps, respectively, and first and second buffers connected between the intermediate taps of the coils and the bases of the first and second transistors, respectively, are arranged in the feedback circuit.

5. The radar oscillator according to claim 3, wherein the first and second LC resonators are formed by $\lambda/4$ transmission paths, respectively.

6. The radar oscillator according to claim 3, comprising a third switch circuit which connects output terminals of the first and second LC resonators to each other until a predetermined period has elapsed after inputting of the pulse signal is stopped, thereby accelerating convergence of the oscillation signal.

7. The radar oscillator according to claim 4, comprising a third switch circuit which connects output terminals of the first and second LC resonators to each other until a predetermined period has elapsed after inputting of the pulse signal is stopped, thereby accelerating convergence of the oscillation signal.

8. The radar oscillator according to claim 5, comprising a third switch circuit which connects output terminals of the first and second LC resonators to each other until a predetermined period has elapsed after inputting of the pulse signal is stopped, thereby accelerating convergence of the oscillation signal.

* * * * *